United States Patent [19]

Kang

[11] Patent Number: 5,191,245
[45] Date of Patent: Mar. 2, 1993

[54] DELAY COMPENSATION CIRCUIT

[75] Inventor: Kyoung-Woo Kang, Taegu-city, Rep. of Korea

[73] Assignee: Samsung Electronics Co., Ltd., Suwon, Rep. of Korea

[21] Appl. No.: 725,768

[22] Filed: Jul. 2, 1991

[30] Foreign Application Priority Data

May 16, 1991 [KR] Rep. of Korea ................. 1991-7988

[51] Int. Cl.$^5$ .......................... H03K 5/12; H03K 3/29
[52] U.S. Cl. .................................. 307/601; 307/263; 307/268; 307/290; 307/603; 307/605
[58] Field of Search ................ 328/164; 307/601, 268, 307/263, 290, 443, 451, 603, 605

[56] References Cited

U.S. PATENT DOCUMENTS 4,700,089 10/1987 Fujii et al. ........................... 307/451

*Primary Examiner*—William L. Sikes
*Assistant Examiner*—Margaret Rose Wambach
*Attorney, Agent, or Firm*—Robert E. Bushnell

[57] ABSTRACT

A delay compensation circuit compensates a signal delay between a signal driver and receiver when transmitting a digital signal through a transmission line. The circuit includes an inverter connected in parallel with the transmission line for inverting the digital signal, and pull-down device connected in parallel with the inverter for compensating a fall time of the digital signal according to an output of the inverter.

13 Claims, 2 Drawing Sheets

DELAY COMPENSATION CIRCUIT

BACKGROUND OF THE INVENTION

The present invention relates to a circuit for compensating delay time of the digital signals transmitted through a transmission line between a signal driver and a receiver, and in particular, to such circuit connectable in parallel with the transmission line in order to reduce the delay time by advantageously modifying the edges of the signals.

Generally, a long transmission line between the signal driver and receiver develops resistive and capacitive impedance that deimpedes the output signal of a driver transmitted to a receiver, thus resulting in a flattened waveform of the signal with increased falling or rising times. Also, the resistive and capacitive impedance causes undesirable power consumption.

FIG. 1 shows a conventional circuit for solving the problem of increased resistive and capacitive impedance in a transmission line. A repeater RP is added between the signal driver 10 and receiver 20.

The repeater RP provided before receiver 20 corrects the distortion of the signal waveform caused by the resistance and capacitance of the transmission line, and reduces the time required for the rising or falling edge of the signal. The repeater generally includes a plurality of inverters connected in multiple stages. The number of the inverters should be even so that the phase of the input signal is the same as that of the output signal. Hence, a minimum of two inverters is necessary to cause delay of the signal. As a result, the repeater provides the correction of the signal waveform, but does not compensate the delay time of the signal.

SUMMARY OF THE INVENTION

It is an object of the present invention to provide a circuit for compensating delay time of a signal through a transmission line caused by the resistance and capacitance thereof.

It is another object of the present invention to provide a circuit for reducing the rise and fall times of the signal on the transmission line.

A delay compensation circuit according to the present invention is connected before a receiver on a transmission line and in parallel to the transmission line, so that the transmission line is supplied with a negative power source ($V_{SS}$) for promptly bypassing the positive charges existing in the transmission line as soon as the falling edge of the transmitted signal is generated, thus minimizing the fall time without delaying the transmitted signal.

BRIEF DESCRIPTION OF THE DRAWINGS

Reference is now made by example in conjunction with the accompanying drawings, in which.

DETAILED DESCRIPTION OF THE PREFERRED EMBODIMENT

Figure 1:
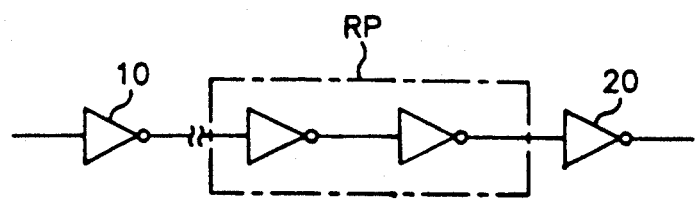
FIG. 1 shows a conventional circuit diagram for a delay compensation circuit.
Figure 2:
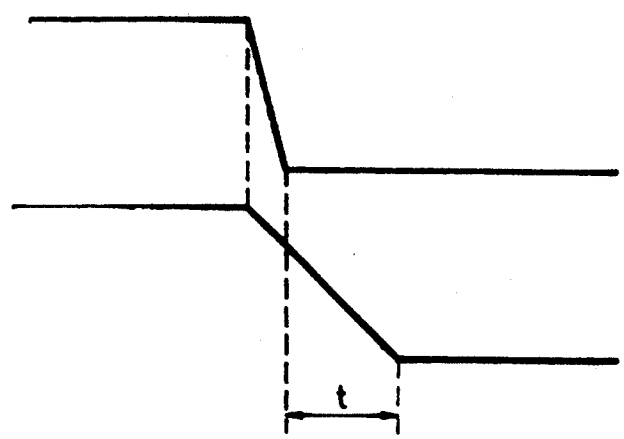
FIG. 2 shows an operational timing diagram of FIG. 1.
Figure 3:
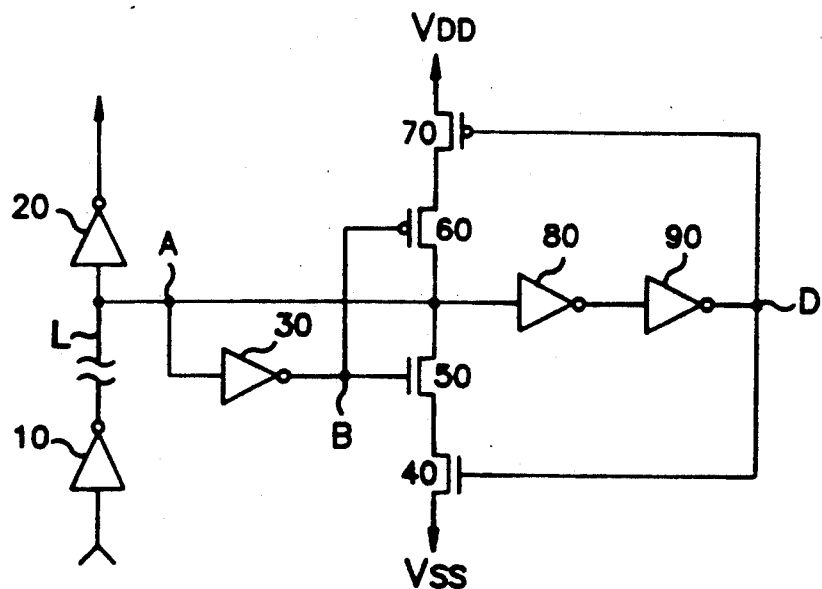
FIG. 3 is a circuit diagram for a delay compensation circuit in accordance with a preferred embodiment of the present invention.

Referring to FIG. 3, the delay compensation circuit is connected in parallel with a transmission line "L" between a driver 10 and receiver 20. The delay compensation circuit includes a sensor 30 for sensing the falling edge of a signal on the transmission line "L", four transistors 40, 50, 60, 70, and a delay circuit comprising two inverters 80 and 90. The gates and drains of the transistors 50 and 60 are interconnected with one another. The connecting point "B" between the gates of the transistors 50 and 60 is connected to an output terminal of the sensor 30. The connecting point "A" between the transmission line "L" and the sensor 30 is connected to an input terminal of the delay circuit. The source and drain of the transistor 40 are respectively connected to a negative power source "$V_{SS}$" and the source of transistor 50. The gate of the transistor 40 is connected to an output terminal of the delay circuit. The source and drain of the transistor 70 are respectively connected to a positive power source "$V_{DD}$" and the source of the transistor 60. The gate of transistor 70 is connected to the output of the delay device.

The transistors 50 and 60 have the same construction and function as an inverter. The trip point of the sensor 30 is positioned at three quarters or more of an interval from a logic "low" to a logic "high" of an input logic signal.

Figure 4:
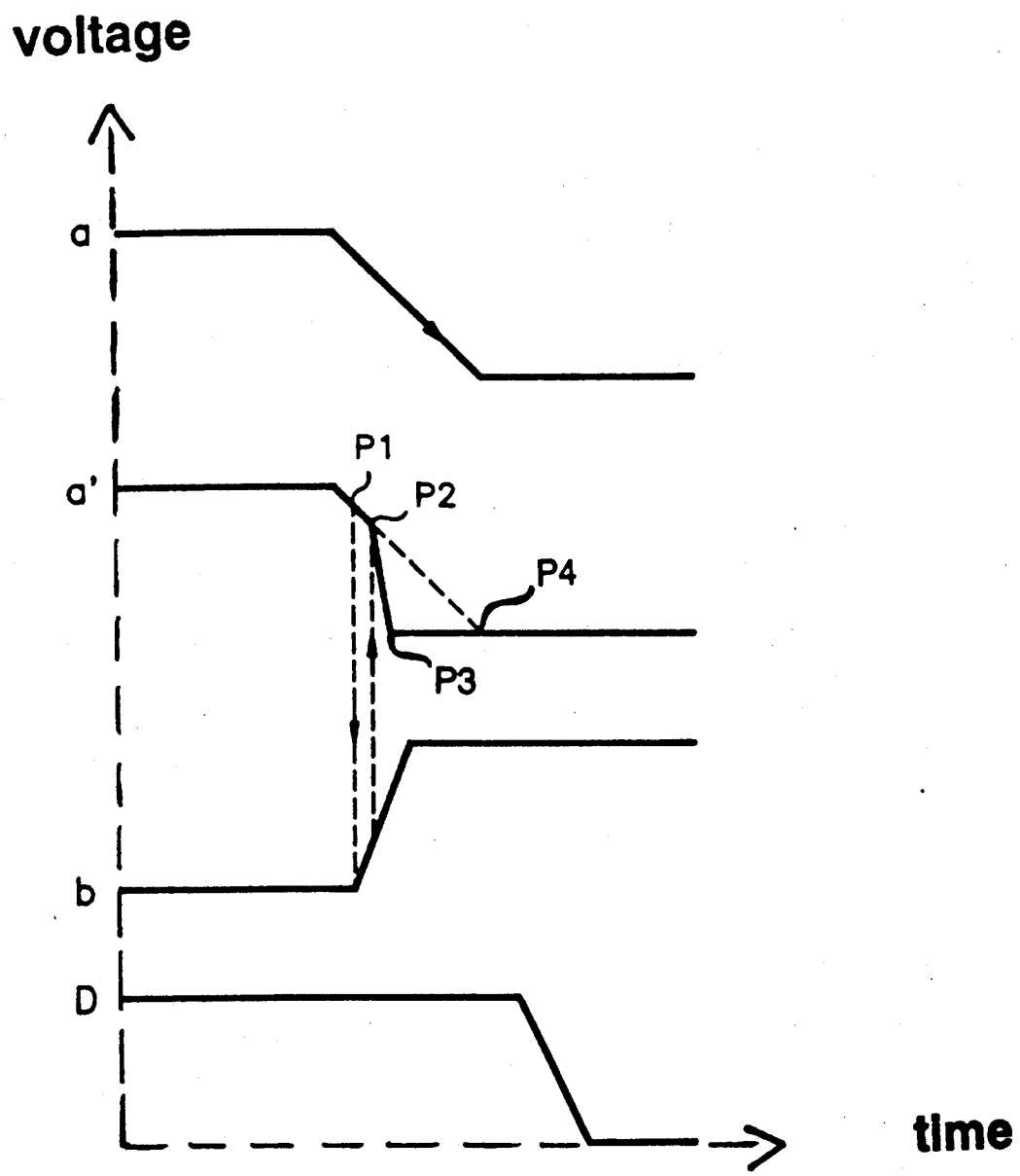
FIG. 4 is an operational timing diagram for the delay compensation circuit of FIG. 3.

For example, when a logic signal "a" as shown in FIG. 4 is transmitted through the transmission line "L", the sensor 30 senses the falling edge of the signal at time $P_1$ shown in "a'", and supplies the signal as shown by "b" to the point "B". In this case, the n-type transistor 50 is turned on, whereas the p-type transistor 60 is turned off. Meanwhile, the delay circuit delays the signal introduced into the point "A". The delay of the signal is accomplished by the inverters 80 and 90, and thus the signal appears at the output of the delay circuit after a predetermined time. Consequently, the output of the delay circuit maintains the previous "high" state during the voltage of the point "A" falling into "low" state.

The gates of the transistors 40 and 70 are connected to the output of the delay circuit, thus maintaining "high" voltage during the falling edge interval when the voltage of the point "A" is in transition from "high" level to "low" level. Of course, the n-type transistor 40 is turned on.

Thus, when the sensor 30 senses the falling edge of the transmitted signal "a" at time "$P_1$" of "a," as shown in FIG. 4, the transistors 40 and 50 are turned on so that the negative power source $V_{SS}$ is connected therethrough with the point "A" at time "$P_2$" in "a'" of FIG. 4, thus preventing any positive charging of point "A". Hence, the voltage of the point "A" is dropped at time "$P_3$" to the negative voltage level of $V_{SS}$.

In this case, if the inventive circuit is not used, the voltage of the point "A" is gradually dropped to $V_{SS}$ at time "$P_4$" as shown by in FIG. 4. However, the inventive circuit decreases the fall time of the logic signal by a time $P_4$ minus $P_3$.

According to experiments, if $V_{CC}=4V$, $V_{SS}=0V$, the temperature is 83° C., and the capacitance of the transmission line is 6pF, the signal delay through the transmission line in the inventive circuit is compared with that in the conventional circuit as shown in the table 1. In this case, a reference "$D_{2V}$" shows a delay time of the transmission signal "a" on transmission line "L" until fall by up to "2V", and a reference "D₁ᵥ" shows another delay time until fall by up to "1V" from the reference "D₂ᵥ". Namely, the inventive circuit reduces the signal delay over 70 percent. Particularly, the inventive circuit is not connected in series but parallel with the transmission line "L", so that the gate delay is eliminated, which is not achieved with the conventional circuit.

TABLE 1

| Condition | $D_{2V}$ | $D_{1V}$ |
|---|---|---|
| Installing the Inventive Circuit | 1.6 ns | 0.6 ns |
| Uninstalling the Inventive Circuit | 1.6 ns | 2.0 ns |

Thus, the inventive circuit substantially eliminates the a distortion of the signal or delay time of the signal caused by the resistance and capacitance inherent in the transmission line.

The descriptions that have been made heretofore with reference to the attached drawings define a preferred embodiment which is intended to be illustrative, not limiting. Various changes may be made without departing from the spirit and scope of the invention as defined in the following claims.

What is claimed is:

1. A circuit for compensating time delay of a digital signal being transmitted by a signal driver through a transmission line having a delay means for correcting waveform distortion due to resistance and capacitance of said transmission line, comprising:
   inverter means coupled to said delay means and said transmission line for receiving said digital signal comprising a logic high level and a logic low level to generate an inverted signal in dependence upon said digital signal; and
   compensator means coupled in parallel to said delay means and said transmission line for compensating for a delay time of said digital signal during a transition from one of said logic high level to said logic low level and said logic low level to said logic high level in response to said inverted signal.

2. The circuit for compensating time delay signals as claimed in claim 1, wherein said compensator means comprises a pair of transistors for applying a negative power source to said transmission line in response to said inverted signal.

3. The circuit for compensating time delay of signals as claimed in claim 1, wherein said inverter means has a trip point located at a transitional position during an interval of transition from said logic high level to said logic low lever, for sensing the transition of said logic high level to said logic low level to generate said inverted signal, said transitional position being set to at least one-quarter of said interval of said transition from said logic high level to said logic low level.

4. A delay compensating circuit, comprising:
   a signal driver for transmitting digital signals through a transmission line;
   delay means coupled to said transmission line for receiving said digital signals to correct waveform distortion of said digital signals, and for generating delayed signals in dependence upon said digital signals;
   signal receiver means for receiving said delayed signals transmitted through said transmission line;
   inverter means coupled to said delay means and said transmission line for receiving digital signals comprising logic high levels and logic low levels to generate an inverted signal in dependence upon one of said digital signals;
   first and second power supply terminals; and
   compensator means coupled in parallel to said delay means and said transmission line for compensating for a delay time of said delayed signals during a transitional interval from one of said logic high levels to one of said logic low levels and one of said logic low levels to one of said logic high levels in response to said inverted signal, said compensator means having an inner pair of P-channel/N-channel transistors and an outermost pair of P-channel/N-channel transistors connected in series with said inner pair of P-channel/N-channel transistors and between said first and second power supply terminals, said inner pair of P-channel/N-channel transistors having a common source and each gate of said P-channel transistor and said N-channel transistor connected to each other and to said inverted signal, said outermost pair of P-channel/N-channel transistors having each gate of said P-channel transistor and said N-channel transistor connected to each other and said delayed signals and a source of said P-channel transistor connected to said first power supply terminal and a source of said N-channel transistor connected to said second power supply terminal.

5. A delay compensating circuit as claimed in claim 4, wherein said first power supply terminal provides a positive power source, and said second power supply terminal provides a negative power source.

6. A delay compensating circuit as claimed in claim 5, wherein said N-channel transistor of said inner pair of P-channel and N-channel transistors and said N-channel transistor of said outermost pair of P-channel and N-channel transistors apply a negative power source in response to said inverted signal for bypassing positive charges existing in said transmission line.

7. A delay compensation circuit for use in a data transmission circuit having a signal driver, a receiver receiving a data transmission signal from the signal driver, and a data transmission line connecting the signal driver and the receiver, said delay compensation circuit comprising:
   sensing means, connected in parallel with the data transmission line, for sensing a transition edge of the data transmission signal having a predetermined transition time and for inverting the data transmission signal; and
   compensation mans connected in parallel with the data transmission line, for supplying in less time than said predetermined transition time a voltage source to the data transmission line after the sensing means has sensed the transition edge of the data transmission signal.

8. The delay compensation circuit of claim 7, further comprising:
   delay means connected in parallel with the data transmission line, for providing a delay in output of the data transmission signal received from the data transmission line, said delay being decreased to correspond to the reduction in said predetermined transition time.

9. The delay compensation circuit of claim 7, wherein the transition edge is a falling edge and the predetermined transition time is a predetermined fall-time, and wherein the compensation means comprises:

pull-down means for supplying a negative voltage from a negative voltage source to the data transmission line in less time than said predetermined fall-time after said sensing means has sensed the falling edge of the data transmission signal.

10. The delay compensation circuit of claim 9, wherein said pull-up means comprises a pair of transistors.

11. The delay compensation circuit of claim 7, wherein the transition edge is a rising edge and the predetermined transition time is a predetermined rise-time, and wherein the compensation means comprises:
pull-up means for supplying a positive voltage from a positive voltage source to the data transmission line in less time than said predetermined rise-time after the sensing means has sensed the rising edge of the data transmission signal.

12. The delay compensation circuit of claim 11, wherein said pull-up means comprises a pair of transistors.

13. A delay compensation circuit for use in a data transmission circuit, said delay compensation circuit comprising:
signal driving means for transmitting a data transmission signal through a transmission line;
delay mans connected in parallel to the transmission line, for correcting waveform distortion of said data transmission signal received from the data transmission line and for generating a delayed data transmission signal;
signal receiving means for receiving said delayed data transmission signal transmitted through said transmission line;
sensing means connected in parallel with the data transmission line, for sensing a transition edge of the data transmission signal having a predetermined transition time and for inverting the data transmission signal; and
compensation means connected in parallel with the data transmission line, for supplying in less time than said predetermined transition time a voltage source to the data transmission line after the sensing means has sensed the transition edge of the data transmission signal.

* * * * *

UNITED STATES PATENT AND TRADEMARK OFFICE
CERTIFICATE OF CORRECTION

PATENT NO. : 5,191,245
DATED : 2 May 1993
INVENTOR(S) : Kyoung-Woo Kang

It is certified that error appears in the above-indentified patent and that said Letters Patent is hereby corrected as shown below:

Column 1,

Line 15,    change "deimpedes" to --impedes--;

Line 17,    delete "of the";

Column 2,

Line 51,    change " "a," " to -- "a' " --;

Column 4,

Line 51,    change "mans" to --means--;

Column 6,

Line 6,    change "mans" to --means--;

Signed and Sealed this

Thirteenth Day of September, 1994

Attest:

BRUCE LEHMAN

*Attesting Officer*    *Commissioner of Patents and Trademarks*